United States Patent
Park (10) Patent No.: US 10,027,301 B2
(45) Date of Patent: Jul. 17, 2018

(54) METHOD AND ELECTRONIC DEVICE FOR CONTROLLING VOLUME

(71) Applicant: Samsung Electronics Co., Ltd., Suwon-si, Gyeonggi-do (KR)

(72) Inventor: Jin-Seok Park, Hwaseong-si (KR)

(73) Assignee: Samsung Electronics Co., Ltd., Suwon-si (KR)

(*) Notice: Subject to any disclaimer, the term of this patent is extended or adjusted under 35 U.S.C. 154(b) by 97 days.

(21) Appl. No.: 14/680,377

(22) Filed: Apr. 7, 2015

(65) Prior Publication Data

US 2015/0326196 A1  Nov. 12, 2015

(30) Foreign Application Priority Data

May 7, 2014 (KR) .................. 10-2014-0053942

(51) Int. Cl.
  *H03G 3/20* (2006.01)
  *H03G 3/32* (2006.01)
  *H03G 3/30* (2006.01)
  H03G 3/34 (2006.01)

(52) U.S. Cl.
  CPC ............. *H03G 3/32* (2013.01); *H03G 3/20* (2013.01); *H03G 3/3005* (2013.01); *H03G 3/342* (2013.01)

(58) Field of Classification Search
  CPC .......... H03G 3/32; H03G 3/20; H03G 3/3005; H03G 3/342
  USPC .................. 381/107, 108; 700/94
  See application file for complete search history.

(56) References Cited

U.S. PATENT DOCUMENTS

| 4,972,491 A | 11/1990 | Wilcox, Jr. et al. |
| 5,796,847 A * | 8/1998 | Kaihotsu ............ H03G 3/32 381/108 |
| 7,302,062 B2 * | 11/2007 | Christoph .......... H03G 3/32 381/103 |
| 2012/0023060 A1 | 1/2012 | Rothkopf |
| 2013/0054251 A1 * | 2/2013 | Eppolito ............ H03G 7/007 704/500 |

FOREIGN PATENT DOCUMENTS

| KR | 10-2004-0018738 A | 3/2004 |
| KR | 10-2005-0004535 A | 1/2005 |

* cited by examiner

*Primary Examiner* — Vivian Chin
*Assistant Examiner* — Douglas Suthers
(74) *Attorney, Agent, or Firm* — Jefferson IP Law, LLP (57) ABSTRACT

An electronic device is provided. The electronic device may output a sound output event through a speaker at an output volume, generate a predicted input waveform based on the output sound event, compare a level of an input sound received via a microphone with a predicted level of the predicted input waveform, determine when a level of the input sound is lower than a threshold value for a predetermined time, and control the output volume of the sound output event when the level of the input sound is lower than the threshold value for the predetermined time.

14 Claims, 6 Drawing Sheets

METHOD AND ELECTRONIC DEVICE FOR CONTROLLING VOLUME

CROSS-REFERENCE TO RELATED APPLICATION(S)

This application claims the benefit under 35 U.S.C. § 119(a) of a Korean patent application filed on May 7, 2014 n the Korean Intellectual Property Office and assigned Serial number 10-2014-0053942, the entire disclosure of which is hereby incorporated by reference.

TECHNICAL FIELD

The present disclosure relates to a method and electronic device for controlling the volume.

BACKGROUND

An electronic device allows a user to enjoy communication services and includes an audio generation function that generates an audio indicator to notify the user of reception of a call or message.

In recent years, electronic devices have evolved into multimedia devices that may offer functions such as photo/video shooting, playback of music or video files, playing video games, reception of broadcast and the like, so the audio generation function is not limited to generating audio indicators.

As these electronic devices have come into wide use, users may conveniently enjoy voice or video calls and other functions such as web surfing, watching videos, listening to music and the like, anytime and anywhere, using the electronic devices.

Nowadays, various noise problems have been emerged due to the ringtones, sound effects, alarms and the like that are produced by the electronic devices. For example, ringtones or received phone conversation sounds, which are frequently generated in a quiet public place such as a conference room, a lecture room or the like, may cause an unnecessary distraction. In such a case, the user may quickly block the speaker of the electronic device to block or reduce the sound coming from the electronic device, but when the sound volume is loud, the user may feel embarrassed.

Further, if the electronic device is positioned on the couch or bed far away from the user or is blocked by obstacles, ringtones, sound effects, alarms and the like from the electronic device would be provided to the user at a reduced level. Accordingly, the user may not perceive the sounds coming from the electronic device.

The above information is presented as background information only to assist with an understanding of the present disclosure. No determination has been made, and no assertion is made, as to whether any of the above might be applicable as prior art with regard to the present disclosure.

SUMMARY

Aspects of the present disclosure are to address at least the above-mentioned problems and/or disadvantages and to provide at least the advantages described below. Accordingly, an aspect of the present disclosure is to provide a method and electronic device that may control the volume so that ringtones or receiver volume may be decreased in public places without the user's volume control when the user attempts to quickly block the speaker of the electronic device.

Another aspect of the present disclosure is to provide a method and electronic device that may control the volume so that ringtones, sound effects, and alarms that are emitted from the electronic device may be sufficiently audible even if the electronic device is placed far away from the user and/or there is an obstacle between the electronic device and the user.

In accordance with an aspect of the present disclosure, a method of controlling an electronic device is provided. The method includes outputting a sound output event through a speaker at an output volume, generating a predicted input waveform based on the output sound event, comparing a level of an input sound received via a microphone with a predicted level of the predicted input waveform, determining when a level of the input sound is lower than a threshold value for a predetermined time, and controlling the output volume of the sound output event when the level of the input sound is lower than the threshold value for the predetermined time.

In accordance with another aspect of the present disclosure, an electronic device is included. The electronic device includes a speaker, a microphone, and a controller configured to output a sound output event through the speaker at an output volume, to generate a predicted input waveform based on the output sound event, to compare a level of an input sound received via a microphone with a predicted level of the predicted input waveform, to determine when a level of the input sound is lower than a threshold value for a predetermined time, and to control when the output volume of the sound output event when the level of the input sound is lower than the threshold value for the predetermined time.

According to an embodiment of the present disclosure, the electronic device may turn down the volume on its own in public places even without the user's control or may turn up the volume under such an environment as renders it difficult for the user to recognize the sound coming from the electronic device, e.g., when the electronic device is positioned far away from the user or there are lots of noise or obstacles that may hamper sound transmission.

Other aspects, advantages, and salient features of the disclosure will become apparent to those skilled in the art from the following detailed description, which, taken in conjunction with the annexed drawings, discloses various embodiments of the present disclosure.

BRIEF DESCRIPTION OF THE DRAWINGS

The above and other aspects, features, and advantages of certain embodiments of the present disclosure will be more apparent from the following description taken in conjunction with the accompanying drawings, in which.

DETAILED DESCRIPTION

The following description with reference to the accompanying drawings is provided to assist in a comprehensive understanding of various embodiments of the present disclosure as defined by the claims and their equivalents. It includes various specific details to assist in that understanding but these are to be regarded as merely exemplary. Accordingly, those of ordinary skill in the art will recognize that various changes and modifications of the various embodiments described herein can be made without departing from the scope and spirit of the present disclosure. In addition, descriptions of well-known functions and constructions may be omitted for clarity and conciseness.

The terms and words used in the following description and claims are not limited to the bibliographical meanings, but, are merely used by the inventor to enable a clear and consistent understanding of the present disclosure. Accordingly, it should be apparent to those skilled in the art that the following description of various embodiments of the present disclosure is provided for illustration purpose only and not for the purpose of limiting the present disclosure as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

The terms "comprise" and/or "comprising" as herein used specify the presence of disclosed functions, operations, or components, but do not preclude the presence or addition of one or more other functions, operations, or components. It will be further understood that the terms "comprise" and/or "have," when used in this specification, specify the presence of stated features, integers, steps, operations, elements, and/or components, but do not preclude the presence or addition of one or more other features, integers, steps, operations, elements, components, and/or groups thereof.

As used herein, the term "and/or" includes any and all combinations of one or more of the associated listed items. For examples, "A or B" may include A, or include B, or include both A and B.

Ordinal numbers as herein used, such as "first", "second", etc., may modify various components of various embodiments of the present disclosure, but do not limit those components. For example, these terms do not limit order and/or importance of corresponding elements, components, regions, layers and/or sections. These terms are only used to distinguish one element, component, region, layer or section from another region, layer or section. For example, a first user device and a second user device refers to two different user devices. Thus, a first element, component, region, layer or section discussed below could be termed a second element, component, region, layer or section without departing from the teachings of the various embodiments of the present disclosure. When the term "connected" or "coupled" is used, a component may be directly connected or coupled to another component or may be indirectly connected or coupled to another component via another new component.

However, if a component is said to be "directly connected" or "directly coupled" to another component, it should be interpreted as literally as it says. The terminology used herein is for the purpose of describing particular embodiments of the present disclosure only and is not intended to be limiting of the various embodiments of the present disclosure. It is to be understood that the singular forms "a," "an," and "the" include plural references unless the context clearly dictates otherwise.

Unless otherwise defined, all terms including technical and scientific terms used herein have the same meaning as commonly understood by one of ordinary skill in the art to which the various embodiments of the present disclosure belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

An electronic device according to various embodiments of the present disclosure may have a communication function. For example, the electronic device may include smart phones, tablet Personal Computers (PCs), mobile phones, video phones, e-book readers, desktop PCs, laptop PCs, netbook computers, Personal Digital Assistants (PDAs), Portable Multimedia Players (PMPs), digital audio players, mobile medical devices, cameras, and wearable devices (e.g., Head-Mounted Devices (HMDs) such as electronic glasses, electronic clothes, electronic bracelets, electronic necklaces, electronic accessories, electronic tattoos, or smart watches).

In various embodiments of the present disclosure, the electronic device may be a smart home appliance that may have a display functionality. The smart home appliance may include at least one of, e.g., televisions, Digital Video Disc (DVD) players, audio systems, refrigerators, air conditioners, cleaning machines, ovens, microwaves, washing machines, air purifiers, set-top boxes, TeleVision (TV) sets (e.g., Samsung HomeSync™, Apple TV™, or Google TV™), game consoles, electronic dictionaries, electronic keys, camcorders, and electronic albums.

In various embodiments of the present disclosure, the electronic device may include part of the furniture or building/structure including a display functionality, electronic boards, electronic signature receiving devices, projectors, and various measuring instruments (e.g., meters for water, electricity, gas, or radio waves). The electronic device in accordance with various embodiments of the present disclosure may be one or a combination of the aforementioned devices. In addition, the electronic device in accordance with various embodiments of the present disclosure may be a flexible device. A person of ordinary skill in the art will recognize that the electronic device is not limited to the aforementioned examples.

Hereinafter, electronic devices according to various embodiments of the present disclosure will be described with reference to the accompanying drawings. As used herein, the term "user" may denote a human or device (e.g., artificial intelligence electronic device) that uses the electronic device.

Figure 1:
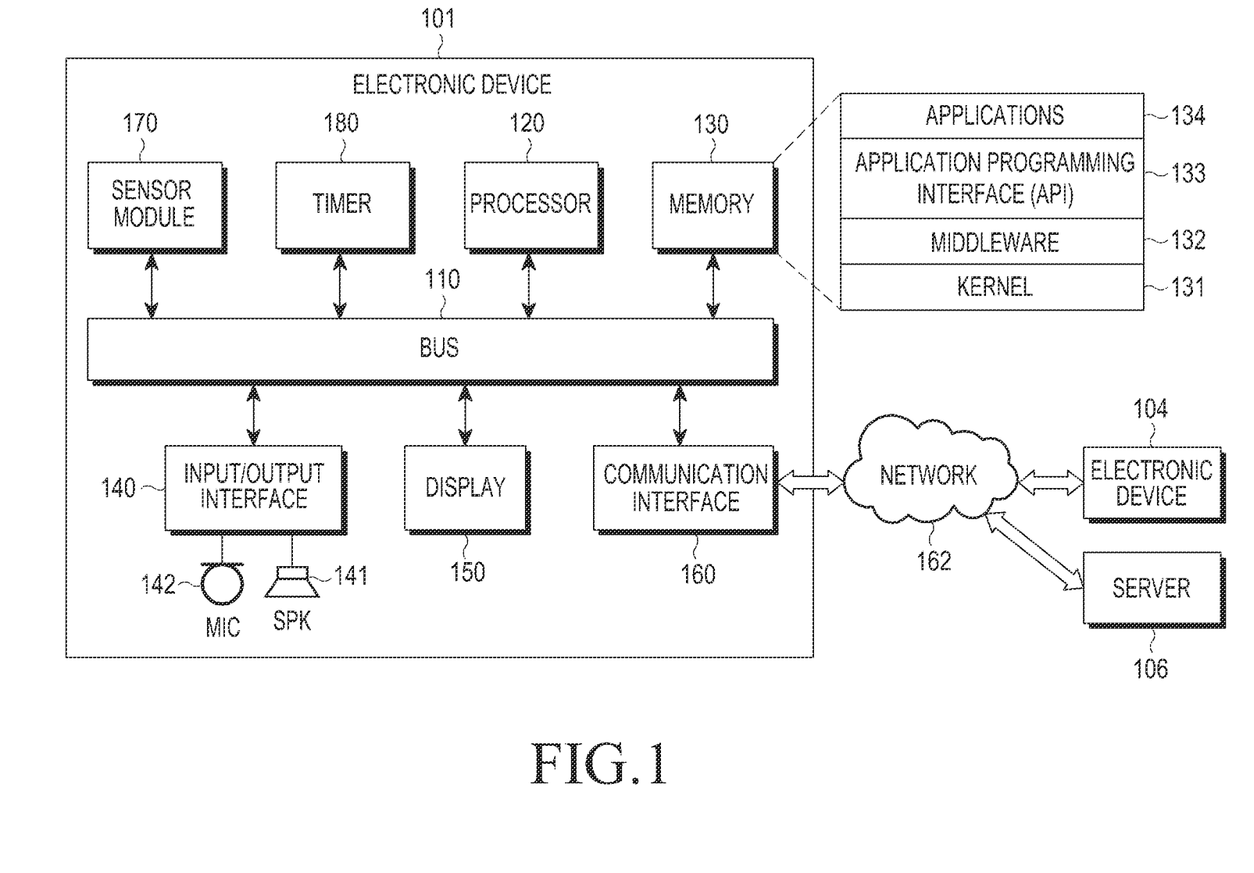
FIG. 1 is a view illustrating a network environment including an electronic device according to an embodiment of the present disclosure.

FIG. 1 illustrates a network environment including an electronic device 101 according to an embodiment of the present disclosure.

Referring to FIG. 1, the electronic device 101 may include a bus 110, a processor 120, a memory 130, an input/output interface 140, a speaker 141, a microphone 142, a display 150, a communication interface 160, a sensor module 170, and a timer 180.

The bus 110 may be a circuit that may connect the above-described components with each other and deliver data (e.g., control message) between the above-described components.

The processor 120 may receive data from other components (e.g., the memory 130, the input/output interface 140, the display 150, the communication interface 160, the sensor module 170, or the timer 180) via, e.g., the bus 110, interpret (or decrypt) the received data, and execute an operation or data processing according to the interpreted (or decrypted) data.

The memory 130 may store a command or data that is received from the processor 120 or other components (e.g., the input/output interface 140, the display 150, the communication interface 160, the sensor module 170, or the timer 180) or generated by the processor 120 or other components. The memory 130 may include programming modules, such as, e.g., a kernel 131, middleware 132, an Application Programming Interface (API) 133, or applications 134. The above-described programming modules may be configured in software, firmware, hardware, or a combination of at least two or more thereof.

The kernel 131 may control or manage system resources (e.g., the bus 110, the processor 120 or the memory 130) for executing operations or functions implemented in the other programming modules, for example, the middleware 132, the API 133, or the applications 134. Further, the kernel 131 may provide an interface that allows the middleware 132, the API 133 or the applications 134 to access individual components of the electronic device 101.

The middleware 132 may serve as a relay through which the API 133 or the application 134 may communicate with the kernel 131 for data transmission and reception. Further, the middleware 132 may perform control (e.g., scheduling or load balancing) of task requests received from the applications 134 by using, e.g., a method of assigning a priority to at least one of the applications 134 in using the system resources (e.g., the bus 110, the processor 120 or the memory 130).

The API 133 is an interface that allows the applications 134 to control functions provided from the kernel 131 or the middleware 132. The API 133 may include at least one interface or function (e.g., command) for controlling an aspect of the electronic device, e.g., a file, image, or text.

According to an embodiment of the present disclosure, the applications 134 may include a Short Message Service (SMS)/Multimedia Messaging Service (MMS) application, an email application, a calendar application, an alarm application, a health care application (e.g., an application for measuring exercise level or blood sugar), and an environmental information application (e.g., an application providing environmental information such as air pressure, moisture, or temperature). Additionally or optionally, the applications 134 may include an application for information exchange between the electronic device 101 and an external electronic device (e.g., electronic device 104). The information exchange-related application may include, e.g., a notification relay application for delivering specific information to the external electronic device or a device management application for managing the external electronic device.

For example, the notification relay application may deliver notification information that is generated from other applications (e.g., the SMS/MMS application, the email application, the health care application, and the environmental information application) of the electronic device 101 to an external electronic device (e.g., electronic device 104). Additionally or optionally, the notification relay application may receive notification information from, e.g., an external electronic device (e.g., electronic device 104) and may provide the received notification information to a user. The device management application may manage (e.g., installing, deleting or updating) the functions of an external electronic device (e.g., electronic device 104) that is communicating with the electronic device 101. For example, the device management application may selectively activate various elements or adjust a display (e.g., brightness or resolution) via an application operating in the external electronic device.

According to an embodiment of the present disclosure, the applications 134 may include an application designated according to an attribute (e.g., type of electronic device) of the external electronic device (e.g., electronic device 104). For example, when the external electronic device is a digital audio player, the applications 134 may include an application relating to playback of music files in the digital audio player. Similarly, when the external electronic device is a mobile medical device, the applications 134 may include an application relating to health care. According to an embodiment of the present disclosure, the applications 134 may include at least one of an application designated in the electronic device 101 and an application received from an external electronic device (e.g., server 106 or electronic device 104).

The input/output interface 140 may transfer commands or data input from a user to the processor 120, the memory 130, the communication interface 160, or the sensor module 170 via, e.g., the bus 110. For example, the input/output interface 140 may provide data of a user's touch that is entered through a touchscreen to the processor 120. Further, the input/output interface 140 may output commands or data received from the processor 120, the memory 130, the communication interface 160, or the sensor module 170 via, e.g., the bus 110. For example, the input/output interface 140 may output voice data processed by the processor 120 to a user via the speaker 141.

According to an embodiment of the present disclosure, the speaker 141 may output a ringtone, a sound effect, or an alarm sound of the electronic device 101, and without being limited thereto, may output sounds that are generated from a voice/video call, web page, a video, and music files. The microphone 142 may receive audio from a source proximate to the electronic device 101. According to an embodiment of the present disclosure, the microphone 142 may also receive a sound through the speaker 141.

The display 150 may display various information (e.g., multimedia data or text data).

The communication interface 160 may provide a communication interface between the electronic device 101 and an external electronic device (e.g., electronic device 104 or server 106). For example, the communication interface 160 may be connected with a network 162 via wireless or wired communication. The wireless communication may include any suitable communication method such as, e.g., Wireless Fidelity (Wi-Fi), Bluetooth (BT), Near Field Communication (NFC), Global Positioning System (GPS), and cellular communication (e.g., Long Term Evolution (LTE), Long Term Evolution-Advanced (LTE-A), Code Division Multiple Access (CDMA), Wideband Code Division Multiple Access (WCDMA), Universal Mobile Telecommunication System (UMTS), Worldwide Interoperability for Microwave Access (WiBro) or Global System for Mobile communication (GSM), and so forth). The wired communication may include, e.g., Universal Serial Bus (USB), High Definition Multimedia Interface (HDMI), Recommended Standard 232 (RS-232), and Plain Old Telephone Service (POTS), and so forth.

According to an embodiment of the present disclosure, the network 162 may be a telecommunication network that includes a computer network, Internet, Internet of things, and telephone network. According to an embodiment of the present disclosure, a protocol (e.g., transport layer protocol, data link layer protocol, or physical layer protocol) for communication between the electronic device 101 and an external electronic device may be supported by any of the applications 134, the API 133, the middleware 132, the kernel 131, and the communication interface 160.

According to an embodiment of the present disclosure, the sensor module 170 may detect changes in the external environment and may deliver the detected information to the processor 120. According to an embodiment of the present disclosure, the sensor module 170 may include a Gyro sensor and may detect a movement of the electronic device 101. The timer 180 may operate for a predetermined time. Various operation times may be set by a user.

According to an embodiment of the present disclosure, an electronic device may include a speaker, a microphone, and a controller configured to output a sound output event through the speaker at an output volume, to generate a predicted input waveform based on the output sound event, to compare a level of an input sound received via a microphone with a predicted level of the predicted input waveform, to determine when a level of the input sound is lower than a threshold value for a predetermined time, and to control when the output volume of the sound output event when the level of the input sound is lower than the threshold value for the predetermined time.

Further, the controller may detect movement of the electronic device and may decrease the predetermined output volume when the movement of the electronic device is detected.

Further, the controller may increase the predetermined output volume when the state is maintained for the predetermined time.

Further, the threshold may be determined by applying a predetermined offset to the predicted input waveform.

Further, the controller may output the sound in the predetermined output volume when the input level is higher than or equal to the threshold.

Further, the controller may output the sound in the predetermined output volume when the state is not maintained for a predetermined monitoring period.

Figure 2:
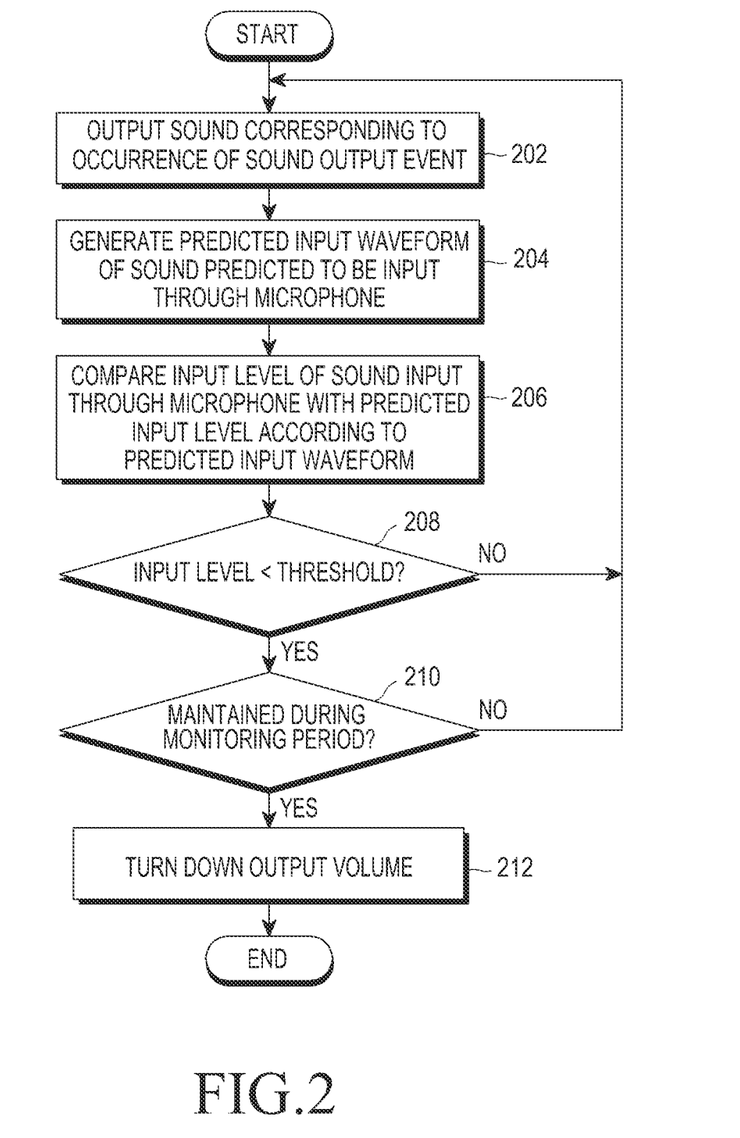
FIG. 2 is a flowchart illustrating a process of controlling volume in an electronic device according to an embodiment of the present disclosure.

FIG. 2 is a flowchart illustrating a process of controlling the volume in an electronic device according to an embodiment of the present disclosure.

Referring to FIG. 2, a sound output event may occur in the electronic device when a call request is received from another electronic device or when a predetermined alarm event occurs. The sound output event may include, but is not limited to, a ringtone, a sound effect, and an alarm sound.

Accordingly, the electronic device may output a sound corresponding to the sound output event at a predetermined volume in operation 202. Thereafter, in operation 204, the electronic device may record and/or generate a predicted input waveform to be input through a microphone, which is based on the output sound. Further, according to an embodiment of the present disclosure, the predicted input waveform may correspond to a predetermined volume level. For example, the predetermined volume level may have, but is not limited to, a fixed value among level 1 through level 3.

Then, the electronic device may compare an input level of an input sound with an input level of the predicted input waveform in operation 206.

As a result of the comparison, it may be determined whether the input level is lower than a threshold value (e.g., a predetermined threshold level) of the predicted input level in operation 208.

When the input level is lower than the threshold value, a user may be in an abnormal environment, and thus, the electronic device may determine whether if the input level is lower than the threshold value for a predetermined monitoring period (e.g., a predetermined time and/or predetermined time period) in operation 210. In contrast, when the input level is determined to be higher than or equal to the threshold value, the electronic device may determine that the user is in a normal environment and may output the sound at the predetermined output volume.

When the input level is lower than the threshold value of the predicted input level for the predetermined monitoring period in operation 210, the electronic device may decrease the output volume in operation 212 so that the speaker volume may be reduced when the user is in an public location and fails to reduce the output volume.

According to an embodiment of the present disclosure, decreasing the volume may include muting the volume. As used herein, the term "muting" may refer to decreasing the output volume to a predetermined volume level or substantially lowering the output volume so that it is inaudible.

Figure 3:
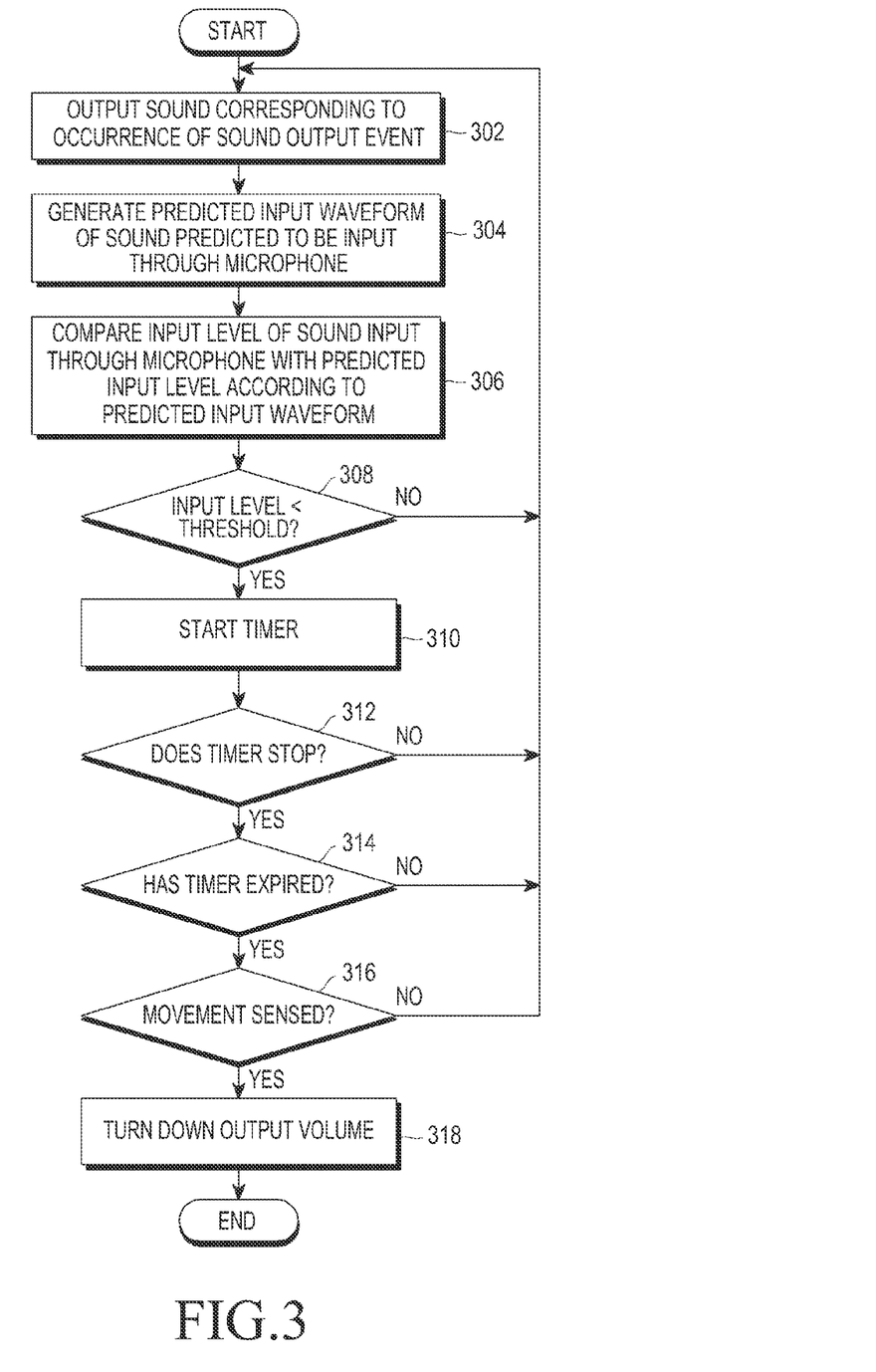
FIGS. 3 and 4 are flowcharts illustrating a process of controlling volume in an electronic device according to another embodiment of the present disclosure.

FIG. 3 is a flowchart illustrating a process of controlling the volume in an electronic device according to another embodiment of the present disclosure.

Referring to FIG. 3, a sound output event may occur in the electronic device by receiving a call request from another electronic device or when a predetermined alarm event occurs. The sound output event may include, but is not limited to, a ringtone, a sound effect, and an alarm sound.

Accordingly, the electronic device may output a sound corresponding to the sound output event through a speaker at a predetermined output volume in operation 302. Then, in operation 304, the electronic device may record and/or generate a predicted input waveform that is to be input though a microphone and is based on the output sound.

Thereafter, the electronic device may compare a level of the input sound with a level of the predicted input waveform in operation 306.

As a result of the comparison, it may be determined whether the input sound level is lower than a threshold value (e.g., a predetermined threshold level) of the predicted input level in operation 308.

When the input level is lower than the threshold value, a user may be determined to be in an abnormal environment and the electronic device may determine if the input sound level is maintained for a predetermined monitoring period (e.g., predetermined time and/or predetermined time period). However, when the input sound level is higher than or equal to the threshold value, the electronic device may determine that the user is in a normal environment and may output the sound at the predetermined output volume.

According to an embodiment of the present disclosure, the electronic device may start a timer for the monitoring period in operation 310. The monitoring period may be preset and/or set by a user, but is not limited thereto. Thereafter, the electronic device may determine whether the timer stops in operation 312.

When the timer stops, the electronic device may output a sound output event through a speaker at a predetermined output volume. In contrast, unless the timer stops, the electronic device may determine whether the timer has expired in operation 314.

When the timer has expired, the electronic device may determine if movement is detected in operation 316, and when movement is detected, the electronic device may decrease the output volume in operation 318. According to an embodiment of the present disclosure, sensing a movement may include, but is not limited to, sensing a movement of a predetermined value (e.g., a threshold value) or more.

Figure 4:
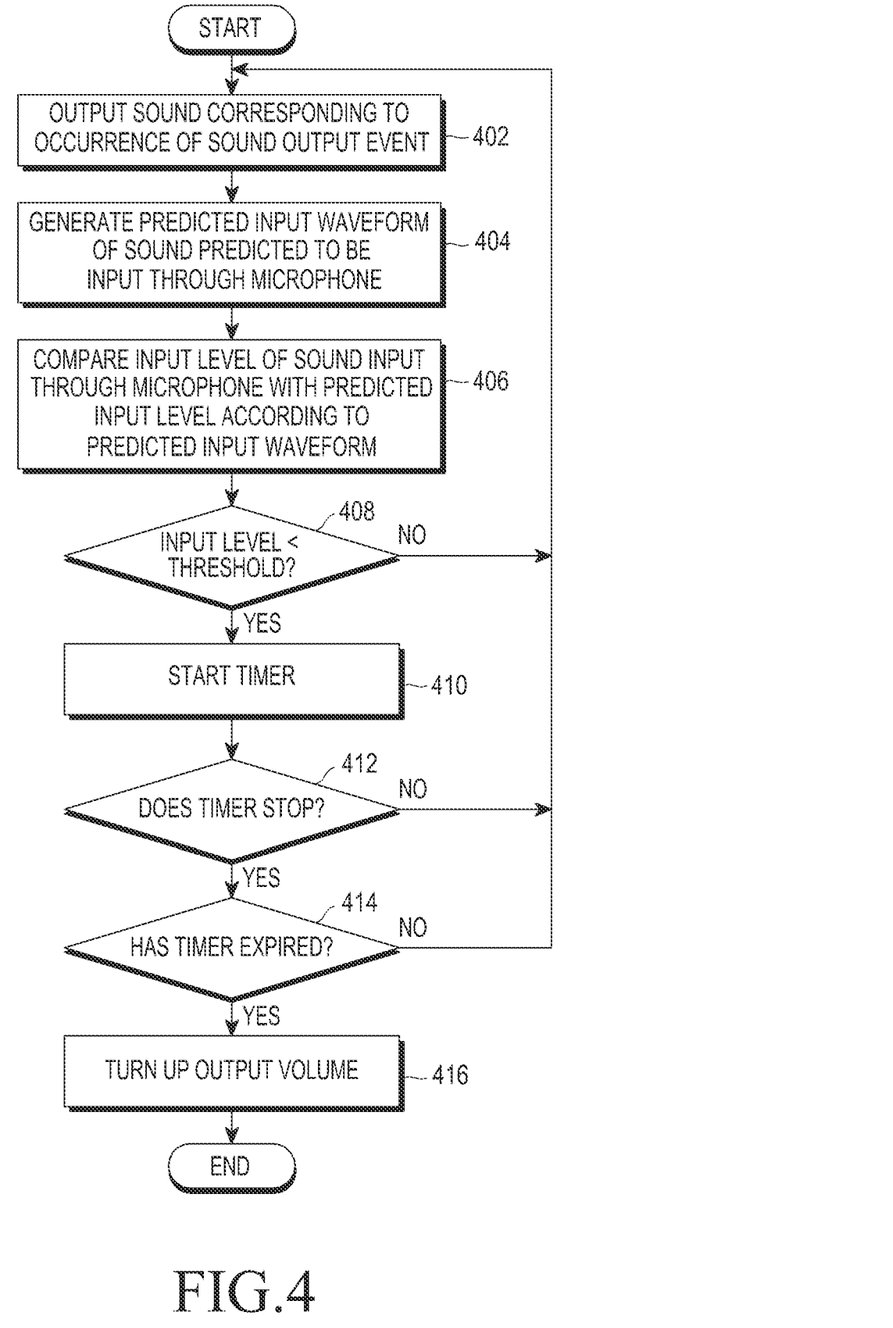

FIG. 4 is a flowchart illustrating a process of controlling volume in an electronic device according to another embodiment of the present disclosure. Operations 402 to 414 shown in FIG. 4 may be the same as operations 302 to 314 shown in FIG. 3.

Referring to FIG. 4, operations 402 to 414 shown in FIG. 4 may be substantially the same as operations 302 to 314 shown in FIG. 3. In FIG. 4, the electronic device may increase the output volume when a timer has expired in operation 416 so that when the electronic device is away from a user by a predetermined distance (for example, when the electronic device is positioned on a bed or couch) or there is an obstacle between the user and the electronic device, the user may hear a ringtone, sound effect, and alarm sound of the electronic device.

Figure 5:
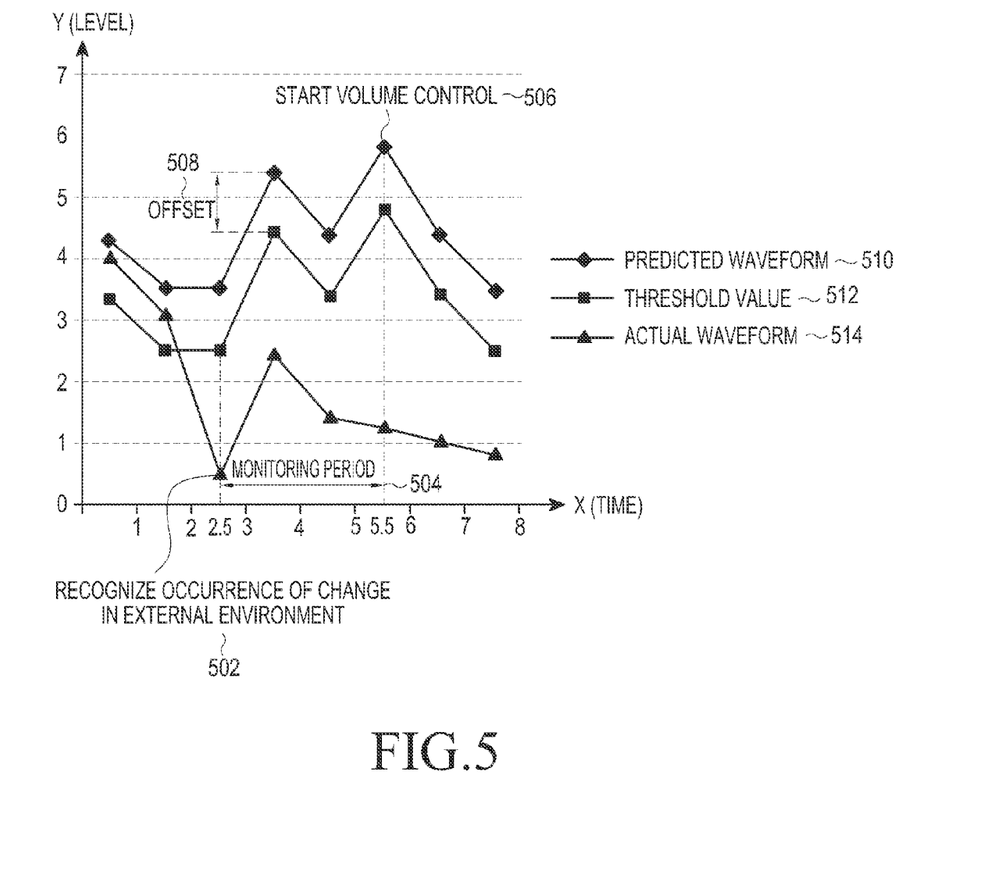
FIG. 5 is a view illustrating an example of controlling the volume of an electronic device according to an embodiment of the present disclosure.

FIG. 5 is a view illustrating an example of controlling the volume of an electronic device according to an embodiment of the present disclosure.

Referring to FIG. 5, the predicted waveform 510 may be a to be input through a microphone, the threshold value 512 may be determined by applying a predetermined offset 508 to the predicted waveform 510, and the actual waveform 514 may be a waveform of a sound input through the microphone. It should be understood that, as used herein, embodiments a threshold value can be a threshold value waveform. For example, threshold value 512, as shown in FIG. 5 and as described herein with the description of FIG. 5, is a threshold value waveform determined based on predicted waveform 510 and actual waveform 514.

According to an embodiment of the present disclosure, the predicted waveform 510 is predicted to be input through the microphone based on a sound event that is produced by the device. The predicted waveform 510 may also be combination of a sound output through the speaker and an ambient noise, which is predicted to be input through the microphone. As such, according to an embodiment of the present disclosure, each electronic device may have different arrangements of parts and mechanisms or different performance depending on it type, and thus, variations can be made to the predicted waveform 510, the threshold value 512, and the actual waveform 514.

Referring to FIG. 5, when the electronic device receives a call request from another electronic device or a predetermined alarm is applied, a sound output event occurs in the electronic device (e.g., an alarm, a ringtone, a sound effect, and so forth). As shown in FIG. 4, the electronic device may compare the level of an actual waveform 514 of a sound input with the level of a predicted waveform 510. According to an embodiment of the present disclosure, the comparison may be conducted based on the threshold value 512. The threshold value may be determined by applying an offset 508 to the predicted waveform 510. For example, the offset 508 may be preset by a user or by the electronic device itself.

As a result of the comparison, when the level of the actual waveform 514 is lower than the threshold value 512, the electronic device may determine that the user is in an abnormal environment. In such a case, for example, the electronic device may recognize that a variation in the external environment has occurred in operation 502 and may start a timer during a monitoring period (e.g., several seconds) in operation 504.

In other words, when the timer starts, the electronic device may determine that the level of the actual waveform 514 is lower than the threshold value 512 during the monitoring period 504, and when the level of the actual waveform 514 is lower than the threshold value 512 after the monitoring period 504 expires, the electronic device may determine a variation and detect a movement at the time of (about) 5.5 seconds to start controlling the volume in operation 506, according to an embodiment of the present disclosure. According to an embodiment of the present disclosure, the X axis represents time during which the level of the actual waveform 514 may be compared with the threshold value and the Y axis represents the level of the actual waveform 514 and the threshold value, which are compared with each other. However, various embodiments of the present disclosure may have various modifications without being limited thereto.

According to an embodiment of the present disclosure, a method of controlling an electronic device may include outputting a sound event through a speaker at a predetermined output volume, generating a predicted input waveform of a sound predicted to be input through a microphone to correspond to a waveform of the output sound based on the output of the sound, comparing an input level of a sound input through the microphone with a predicted input level according to the predicted input waveform, determining whether a state where the input level is lower than a threshold value of the predicted input level is maintained for a predetermined time, and controlling a volume when the state is maintained for the predetermined time.

The method of controlling the electronic device may further include determining whether a movement of the electronic device is detected, and decreasing the predetermined output volume when the movement of the electronic device is detected.

The method of controlling the electronic device may further include increasing the predetermined output volume when the state is maintained for the predetermined time.

The method of controlling the electronic device may further include determining the threshold by applying a predetermined offset to the predicted input waveform.

The method of controlling the electronic device may further include outputting the sound at the predetermined volume when the input level is higher than or equal to the threshold.

The method of controlling the electronic device may further include outputting the sound at the predetermined output volume level when the state is not maintained for a predetermined monitoring period.

Figure 6:
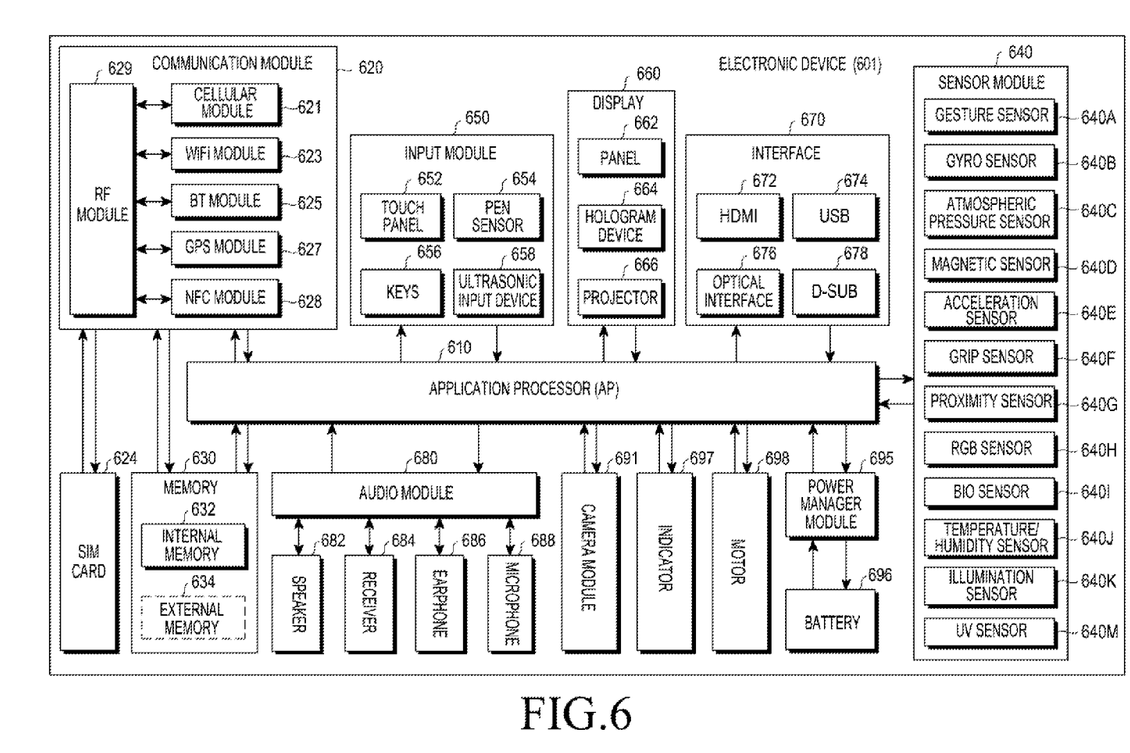
FIG. 6 is a block diagram illustrating an electronic device according to various embodiments of the present disclosure.

FIG. 6 is a block diagram of an electronic device 601 according to various embodiments of the present disclosure. The electronic device 601 may constitute the entire or some of the electronic device 101 shown in FIG. 1.

Referring to FIG. 6, the electronic device 601 may be a more detailed block diagram of the electronic device 101 shown in FIG. 1. Specifically, the electronic device 601 may include one or more Application Processors (APs) 610, a communication module 620, a Subscriber Identification Module (SIM) card 624, a memory 630, a sensor module 640, an input module 650, a display 660, an interface 670, an audio module 680, a camera module 691, a power manager module 695, a battery 696, an indicator 697, and a motor 698.

The AP 610 may control hardware and software components connected to the AP 610 by running an operating system or application programs, and may perform data processing and control operations. The AP 610 may be implemented in, e.g., a System on Chip (SoC). In accordance with an embodiment of the present disclosure, the AP 610 may further include a Graphic Processing Unit (GPU) (not shown).

The communication module 620 (corresponding to the communication interface 160 as shown in FIG. 1) may communicate data with other electronic devices, such as the external electronic device 104 and the server 106. In accordance with an embodiment of the present disclosure, the communication module 620 may include a cellular module 621, a Wi-Fi module 623, a BT module 625, a GPS module 627, an NFC module 628, and a Radio Frequency (RF) module 629.

The cellular module 621 may provide voice calls, video calls, SMS or Internet services over a communication network, such as LTE, LTE-A, CDMA, WCDMA, UMTS, WiBro, GSM, etc. The cellular module 621 may also identify and authenticate an electronic device in the communication network in cooperation with the SIM card 624. In accordance with an embodiment of the present disclosure, the cellular module 621 may perform at least some of the functions that the AP 610 may provide. For example, the cellular module 621 may perform at least a part of multimedia control function.

In an embodiment of the present disclosure, the cellular module 621 may include a Communication Processor (CP) (not shown). The cellular module 621 may also be implemented in, e.g., an SoC. While the components of FIG. 6, such as the cellular module 621 (e.g., a CP), the memory 630 or the power manager module 695 are illustrated as being separate from the AP 610, the AP 610 may incorporate some of the aforementioned components (e.g., the cellular module 621) in other embodiments of the present disclosure, or the CP may be provided in a separate module.

In accordance with an embodiment of the present disclosure, the AP 610 or the cellular module 621 (e.g., a CP) may load a command or data received from at least one of a non-volatile memory and other components connected to the AP 610 or the cellular module 621, and then process the command or data. In addition, the AP 610 or the cellular module 621 may store, in a non-volatile memory, the data that is received from at least one of the other components or generated by at least one of the other components.

The Wi-Fi module 623, the BT module 625, the GPS module 627, and the NFC module 628 may each include a processor for processing data sent or received through the corresponding module. While FIG. 6 illustrates each of the cellular module 621, the Wi-Fi module 623, the BT module 625, the GPS module 627, and the NFC module 628 as a separate block, any of these modules may be incorporated in a single Integrated Circuit (IC) or an IC package in other various embodiments of the present disclosure. For example, at least some of processors corresponding to the cellular module 621, the Wi-Fi module 623, the BT module 625, the GPS module 627, and the NFC module 628, e.g., a CP of the cellular module 621 and a Wi-Fi processor of the Wi-Fi module 623 may be implemented in a single SoC.

The RF module 629 may perform data communication, more specifically, RF signal communication. The RF module 629 may include, e.g., a transceiver, a Power Amp Module (PAM), a frequency filter, and a Low Noise Amplifier (LNA) (not shown). The RF module 629 may further include other devices necessary for transmitting or receiving RF signals over the air in wireless communication (e.g., antennas such as conductors, wires, etc.). While FIG. 6 illustrates that the cellular module 621, the Wi-Fi module 623, the BT module 625, the GPS module 627, and the NFC module 628 share the single RF module 629, any of these modules may perform RF signal communication through a separate RF module.

The SIM card 624 may include a subscriber identification module that may be inserted into a slot formed in the electronic device.

The SIM card 624 may include unique identification information, such as Integrated Circuit Card Identifier (IC-CID), or subscriber information, such as International Mobile Subscriber Identity (IMSI).

The memory 630 (corresponding to the memory 130 in FIG. 1) may include an internal memory 632 and an external memory 634. The internal memory 632 may include, e.g., at least one of a volatile memory (such as Dynamic Random Access Memory (DRAM), Static RAM (SRAM), Synchronous Dynamic RAM (SDRAM), or the like) and a non-volatile memory (such as One Time Programmable Read Only Memory (OTPROM), Programmable ROM (PROM), Erasable and Programmable ROM (EPROM), Electrically Erasable and Programmable ROM (EEPROM), mask ROM, flash ROM, Not AND (NAND) flash memory, Not OR (NOR) flash memory, or the like).

In an embodiment of the present disclosure, the internal memory 632 may be a Solid State Drive (SSD). The external memory 634 may include a flash drive, such as Compact Flash (CF), Secure Digital (SD), Micro Secure Digital (Micro-SD), Mini Secure Digital (Mini-SD), extreme Digital (xD), memory stick, or the like. The external memory 634 may be functionally connected to the electronic device 601 through various interfaces. In an embodiment of the present disclosure, the electronic device 601 may further include a storage device (or a storage medium), such as a hard drive.

The sensor module 640 may measure a physical quantity or convert information measured or detected by monitoring the electronic device 601 into an electric signal. The sensor module 640 may include at least one of a gesture sensor 640A, a gyro sensor 640B, an atmospheric pressure sensor 640C, a magnetic sensor 640D, an acceleration sensor 640E, a grip sensor 640F, a proximity sensor 640G, a color sensor 640H (such as a Red, Green, Blue (RGB) sensor), a bio sensor 640I, a temperature/humidity sensor 640J, an illumination sensor 640K, and an Ultra Violet (UV) sensor 640M. Additionally or alternatively, the sensor module 640 may include an E-nose sensor, an ElectroMyoGraphy (EMG) sensor, an ElectroEncephaloGram (EEG) sensor, an ElectroCardioGram (ECG) sensor, an InfraRed (IR) sensor, an iris sensor, a finger print sensor, or the like. The sensor module 640 may further include a control circuit for controlling at least one or more of the sensors included in the sensor module 640.

The input unit 650 may include a touch panel 652, a (digital) pen sensor 654, one or more keys 656, or an ultrasonic input device 658. The touch panel 652 may recognize touch inputs via at least one of capacitive, resistive, infrared, and ultrasonic detection methods. The touch panel 652 may further include a control circuit. With the capacitive method, physical contact or proximity detection may be possible. The touch panel 652 may further include a tactile layer to provide the user with a tactile response.

The (digital) pen sensor 654 may be implemented in a way similar to, e.g., how a touch input of a user is received, or by using a separate sheet for recognition. The keys 656 may include, e.g., a physical button, an optical key or a key pad. The ultrasonic input device 658 may use an input tool that generates an ultrasonic signal and enable the electronic device 601 to determine data by sensing the ultrasonic signal with the microphone 688, thereby enabling wireless recognition. In an embodiment of the present disclosure, the electronic device 601 may receive a user input from an external device (such as a computer or a server) that is connected to the electronic device 601, through the communication module 620.

The display 660 (corresponding to the display 150 in FIG. 1) may include at least one of a panel 662, a hologram device 664, and a projector 666. The panel 662 may be, e.g., a Liquid Crystal Display (LCD), Active Matrix Organic Light Emitting Diodes (AMOLEDs), or the like. The panel 662 may be implemented to be flexible, transparent, or wearable. The panel 662 may also be incorporated with the touch panel 652 in a single module. The hologram device 664 may make three dimensional (3D) images (holograms) in the air by using light interference. The projector 666 may display an image by projecting light onto a screen. The screen may be, for example, located inside or outside of the electronic device 601. In accordance with an embodiment of the present disclosure, the display 660 may further include a control circuit to control the panel 662, the hologram device 664, or the projector 666.

The interface 670 may include, e.g., an HDMI 672, a USB 674, an optical interface 676, or a D-subminiature (D-sub) 678. The interface 670 may be included in, e.g., the communication interface 60 shown in FIG. 1. Additionally or alternatively, the interface 670 may include a Mobile High-definition Link (MHL) interface, an SD card/Multimedia Card (MMC) interface, or an Infrared Data Association (IrDA) interface.

The audio module 680 may perform processes (e.g., encoding or decoding) relating to converting a sound wave and audio signal into an electric signal and/or vice versa. At least a part of the audio module 680 may be incorporated into, e.g., the electronic device 101 as shown in FIG. 1. The audio module 680 may process sound information input or output through, e.g., a speaker 682, a receiver 684, an earphone 686, or a microphone 688.

The camera module 691 may capture still images and videos, and may include one or more image sensors (e.g., front and back sensors), a lens, an Image Signal Processor (ISP), or a flash such as an LED or xenon lamp.

The power manager module 695 may manage power of the electronic device 601. Although not shown, e.g., a Power Management Integrated Circuit (PMIC), a charger IC, or a battery or fuel gauge may be incorporated in the power manager module 695.

The PMIC may be mounted on, e.g., an IC or an SOC. A charging method may be divided into wired and wireless charging methods. The charger IC may charge a battery and prevent overvoltage or overcurrent from being induced from a charger. In an embodiment of the present disclosure, the charger IC may be used in at least one of a cable charging scheme and a wireless charging scheme. The wireless charging scheme may include, e.g., a magnetic resonance scheme, a magnetic induction scheme, or an electromagnetic wave based scheme, and an additional circuit, such as a coil loop, a resonance circuit, a rectifier, or the like may be added for wireless charging.

The battery gauge may measure an amount of remaining power of the battery 696, a voltage, a current, or a temperature while the battery 696 is being charged. The battery 696 may save or generate electricity, and supply power to the electronic device 601 with the saved or generated electricity. The battery 696 may include, e.g., a rechargeable battery or a solar battery.

The indicator 697 may indicate a particular state of the electronic device 601 or a part of the electronic device (e.g., the AP 610), the particular state including, e.g., a booting state, a message state, or a charging state. The motor 698 may convert electric signals to mechanical vibrations. Although not shown, a processing unit for supporting mobile TV, such as a GPU, may be incorporated in the electronic device 601. The processing unit for supporting mobile TV may process media data conforming to a standard for Digital Multimedia Broadcasting (DMB), Digital Video Broadcasting (DVB), or Media Flow.

Each of the aforementioned components of the electronic device may include one or more parts, and a name of the part may vary with a type of the electronic device. The electronic device in accordance with various embodiments of the present disclosure may include at least one of the aforementioned components, omit some components, or include other additional component(s). Some of the components may be combined into a single entity, but the entity may perform the same functions as the components may do.

As used herein, the term "user" may denote a person or device (e.g., artificial intelligence electronic device) using the electronic device.

The term 'module' may refer to a unit including one of hardware, software, and firmware, or a combination thereof. The term 'module' may be interchangeably used with a unit, logic, logical block, component, or circuit. The module may be a minimum unit or part of an integrated component. The module may be a minimum unit or part of performing one or more functions. The module may be implemented mechanically or electronically. For example, the module may include at least one of Application Specific Integrated Circuit (ASIC) chips, Field Programmable Gate Arrays (FPGAs), and Programmable Logic Arrays (PLAs) that perform some operations, which have already been known or will be developed in the future.

At least a part of the device (e.g., modules or their functions) or method (e.g., operations) may be implemented as instructions stored in a non-transitory computer-readable storage medium, e.g., in the form of a programming module. The instructions, when executed by one or more processor (e.g., the processor 120), may cause the processor to carry out a corresponding function. The non-transitory computer-readable storage medium may be, e.g., the memory 130. At least a part of the programming module may be implemented by, e.g., the processor 120. At least a part of the programming module may include, e.g., a module, program, routine, set of instructions, process, or the like for performing one or more functions.

The non-transitory computer-readable storage medium may include a hardware device configured to store and perform program instructions (e.g., programming module), such as magnetic media such as hard discs, floppy discs, and magnetic tapes, optical media such as Compact Disc ROMs (CD-ROMs) and DVDs, magneto-optical media such as floptical disks, ROMs, RAMs, Flash Memories, and/or the like. Examples of the program instructions may include not only machine language codes but also high-level language codes which are executable by various computing means using an interpreter. The aforementioned hardware devices may be configured to operate as one or more software modules to carry out various embodiments of the present disclosure, and vice versa.

Modules or programming modules in accordance with various embodiments of the present disclosure may include at least one or more of the aforementioned components, omit some of them, or further include other additional components. Operations performed by modules, programming modules or other components in accordance with various embodiments of the present disclosure may be carried out sequentially, simultaneously, repeatedly, or heuristically. Furthermore, some of the operations may be performed in a different order, or omitted, or include other additional operation(s).

In accordance with various embodiments of the present disclosure, provided is a storage medium having instructions stored thereon, and the instructions, when executed by at least one processor, may cause the at least one processor to perform at least one operation including output a sound output event through a speaker at an output volume, generate a predicted input waveform based on the output sound event, compare a level of an input sound received via a microphone with a predicted level of the predicted input waveform, determine when a level of the input sound is lower than a threshold value for a predetermined time, and control the output volume of the sound output event when the level of the input sound is lower than the threshold value for the predetermined time.

While the present disclosure has been shown and described with reference to various embodiments thereof, it will be understood by those skilled in the art that various changes in form and details may be made therein without departing from the spirit and scope of the present disclosure as defined by the appended claims and their equivalents.

What is claimed is:

1. A method of controlling an electronic device, the method comprising:
    outputting a sound output event through a speaker at a first output volume;
    generating a predicted input waveform based on the sound output event;
    comparing a level of an input sound received via a microphone with a predicted level of the predicted input waveform;
    determining a threshold value waveform by subtracting an offset value from the predicted level of the predicted input waveform;
    outputting a sound at a second output volume when the level of the input sound received via the microphone is lower than the threshold value waveform of the predicted input waveform for a predetermined duration of time.

2. The method of claim 1, wherein the second output volume is lower than the first output volume when the level of the input sound received via the microphone is lower than the threshold value waveform for the predetermined duration of time.

3. The method of claim 1, further comprising:
    determining whether a movement of the electronic device is detected; and
    outputting a sound at a third output volume which is lower than the second output volume when the movement of the electronic device is detected.

4. The method of claim 1, wherein the offset value is predetermined.

5. The method of claim 1, further comprising outputting the sound at the first output volume when the level of the input sound received via the microphone is higher than or equal to the threshold value waveform below the predicted level of the predicted input waveform.

6. The method of claim 1, further comprising, calculating the predicted level of the predicted input waveform based on a configuration of the electronic device.

7. The method of claim 6, wherein the predicted level of the predicted input waveform is based on a location of the speaker that outputs the sound output event and a location of the microphone that receives the sound output event.

8. An electronic device comprising:
    a speaker;
    a microphone; and
    at least one processor configured to:
        output a sound output event through the speaker at a first output volume,
        generate a predicted input waveform based on the sound output event,
        compare a level of an input sound received via the microphone with a predicted level of the predicted input waveform,
        determine a threshold value waveform by subtracting an offset value from the predicted level of the predicted input waveform;
        output a sound at a second output volume when the level of the input sound received via the microphone is lower than the threshold value waveform of the predicted input waveform for the predetermined duration of time.

9. The electronic device of claim 8, wherein the at least one processor is further configured to control the second output volume to be lower than the first output volume when the level of the input sound received via the microphone is lower than the threshold value waveform for the predetermined duration of time.

10. The electronic device of claim 8, wherein the at least one processor is further configured to:
    determine whether a movement of the electronic device is detected, and
    output a sound at a third output volume which is lower than the second output volume when the movement of the electronic device is detected.

11. The electronic device of claim 8, wherein the offset value is predetermined.

12. The electronic device of claim 8, wherein the at least one processor is further configured to output the sound at the first output volume when the level of the input sound received via the microphone is higher than or equal to the threshold value waveform below the predicted level of the predicted input waveform.

13. The electronic device of claim 8, wherein the at least one processor is configured to calculate the predicted level of the predicted input waveform based on a configuration of the electronic device.

14. The electronic device of claim 13, wherein the predicted level of the predicted input waveform is based on a location of the speaker that outputs the sound output event and a location of the microphone that receives the sound output event.

* * * * *